(12) United States Patent
Hirano et al.

(10) Patent No.: US 8,127,205 B2
(45) Date of Patent: Feb. 28, 2012

(54) ERROR CORRECTION CODE GENERATION METHOD AND MEMORY CONTROL DEVICE

(75) Inventors: Takahito Hirano, Kawasaki (JP); Takashi Miura, Kawasaki (JP); Iwao Yamazaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 1178 days.

(21) Appl. No.: 11/864,057

(22) Filed: Sep. 28, 2007

(65) Prior Publication Data

US 2008/0163029 A1    Jul. 3, 2008

(30) Foreign Application Priority Data

Dec. 27, 2006  (JP) ................. 2006-353505

(51) Int. Cl.
    *G11C 29/00* (2006.01)
(52) U.S. Cl. .................................. 714/768
(58) Field of Classification Search .......... 714/762–764, 714/768
    See application file for complete search history.

(56) References Cited

U.S. PATENT DOCUMENTS 5,058,116 A   10/1991   Chao et al.
(Continued)

FOREIGN PATENT DOCUMENTS

JP    3-108041    5/1991
(Continued)

OTHER PUBLICATIONS

Roberts, D.; Nam Sung Kim; Mudge, T.; , "On-Chip Cache Device Scaling Limits and Effective Fault Repair Techniques in Future Nanoscale Technology," Digital System Design Architectures, Methods and Tools, 2007. DSD 2007. 10th Euromicro Conference on , vol., No., pp. 570-578, Aug. 29-31, 2007 doi: 10.1109/DSD.2007.4341526.*

Japanese Office Action mailed Dec. 27, 2011 in corresponding Japanese Application No. 2006-353505.

*Primary Examiner* — Cynthia Britt
(74) *Attorney, Agent, or Firm* — Staas & Halsey LLP

(57) ABSTRACT

A correct error correction code can be generated even if a RAM error occurs before writing store data in cache memory (RAM) after confirming that cache line data for storage includes no errors. Before writing the store data, cache line data for storage is stored in a register, the store data is written to the cache memory, the stored contents of the register are merged with the store data, and an error correction code is generated for a result of the merger.

8 Claims, 10 Drawing Sheets

U.S. PATENT DOCUMENTS

| | | | |
|---|---|---|---|
| 5,418,973 A * | 5/1995 | Ellis et al. ......................... 712/3 |
| 5,544,340 A * | 8/1996 | Doi et al. ....................... 711/118 |
| 5,687,353 A * | 11/1997 | Chen et al. .................... 711/155 |
| 6,408,417 B1 | 6/2002 | Moudgal et al. |
| 2004/0225943 A1 * | 11/2004 | Brueggen ..................... 714/758 |

FOREIGN PATENT DOCUMENTS

| | | |
|---|---|---|
| JP | 2001-84064 | 3/2001 |
| JP | 2004-514184 | 5/2004 |

\* cited by examiner

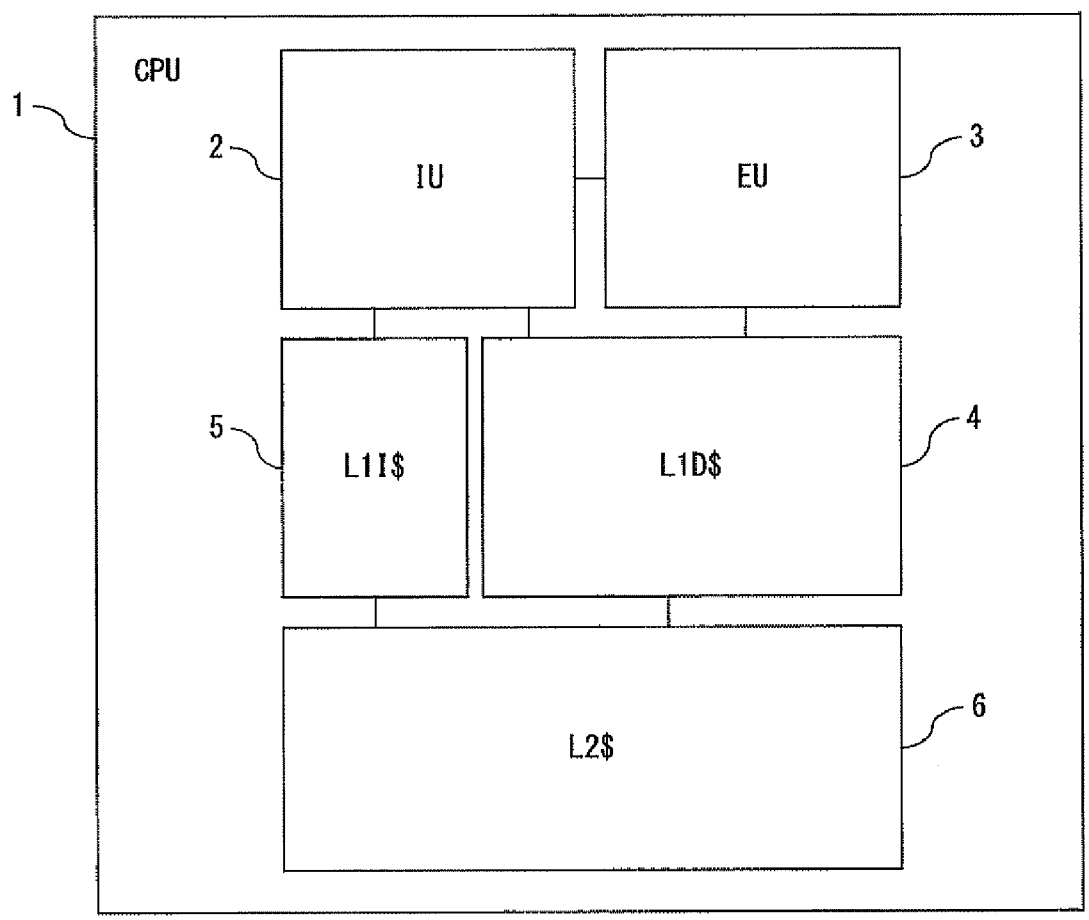
F I G. 3

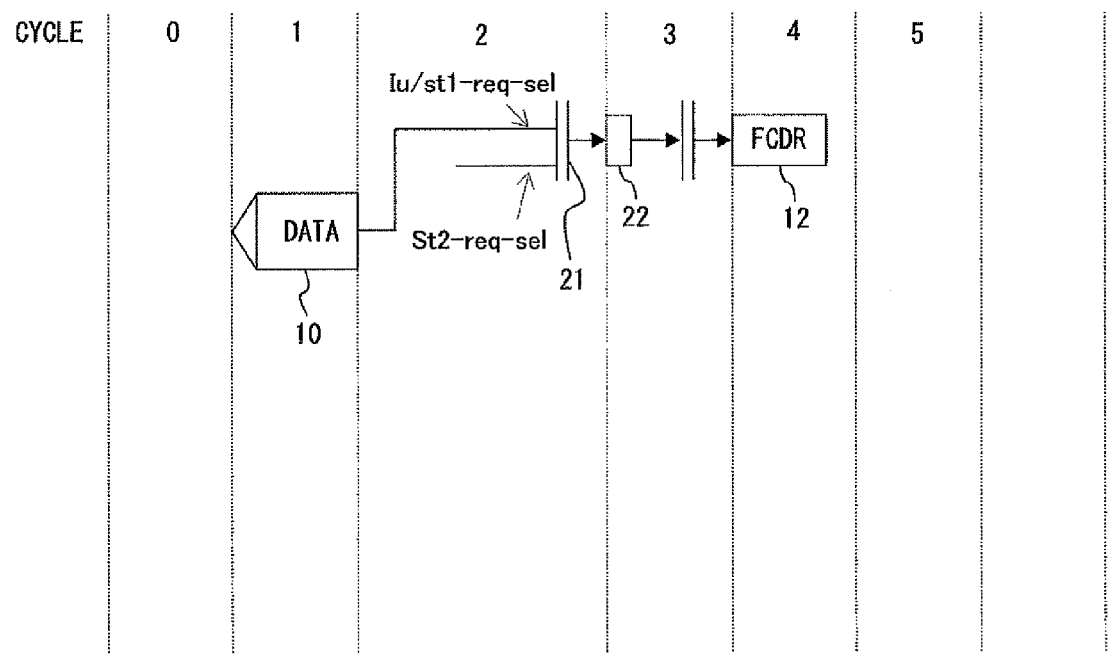
F I G. 6

ERROR CORRECTION CODE GENERATION METHOD AND MEMORY CONTROL DEVICE

BACKGROUND OF THE INVENTION

1. Field of the Invention

The present invention relates to a cache memory control system, and more specifically to an error correction code generation method for use in writing data to cache memory and a cache memory control device for controlling the generation of error correction codes.

2. Description of the Related Art

A system for storing some data from a main memory in a cache memory that is close to the central processing unit (CPU) of a computer to improve the processing speed of the CPU has conventionally been used. The data stored in the cache memory is protected by adding an error correction code (ECC).

However, with the recent technology of downsized semiconductor, the storage elements configuring RAM used as cache memory have also been downsized, and stored data are easily inverted. In the circuit inside the RAM, the margin for controlling internal operation timing is often reduced to improve the operation frequency, thereby restricting the voltages and the temperatures at which operations can be performed and resulting in a lower reliability in holding data against fluctuations of voltage and temperature.

With the situation above, faults occur in various modes in cache memory. In the first mode, a software error occurs in which an inverted value of a RAM cell is generated due to the conflict of, for example, an alpha ray. In the second mode, the value of a RAM cell is not correctly updated when data is written. In these first and second modes, the values in the RAM are destroyed.

In the third mode, the value of a RAM cell is inverted due to the charging of a read line when the value of the RAM cell is read. In the fourth mode, the correct value of a RAM cell is not read due to write recovery troubles.

The write recovery troubles may be, for example, an error in SRAM, which is a phenomenon in which the margin for carrying out the reading of data in the subsequent cycle is reduced because written data, immediately before it is read, stays on the bit line when the data is read immediately after the data is written to the SRAM. When this phenomenon occurs, the delay time is extended when it is not severe and a read error occurs when it is severe.

The influence of the fault of the RAM on the generation of an ECC is described below by referring to FIG. 1. FIG. 1 is an explanatory view of the conventional technology in the error correction code generation system used when data is written to cache memory. In this example, it is assumed that one line in cache memory has 8-bytes. The conventional system of generating an error correction code is described below by assuming that data is written to the first half of a line, i.e., 4-bytes.

In the conventional system shown in FIG. 1, data in the cache line for storage in the cache memory is checked by a store instruction issued from an instruction unit in the CPU. After it is confirmed that no errors are contained in the cache line for storage, the store data actually received from, for example, an arithmetic unit, is written to the cache memory. FIG. 1 is an explanatory view of the generation of an error correction code when store data is written to the cache memory as the second stage after confirming that no errors are contained in the cache lines for storage.

First, in cycle 0, the store data output from the arithmetic unit is stored in the store buffer (STB) and supplied as write data to the cache memory in cycle 1. In cycle 1, the data in the cache line for storage in the cache memory, that is, the cache line in which it is confirmed at the first stage that there are no errors, is simultaneously output and merged with the store data stored in the store buffer in cycle 2. In cycle 3, an error correction code is generated for the data as a result of the merger. In cycle 4, the ECC is registered in ECC storage RAM for storing an ECC. That is, for higher speed cache access, an ECC is generated after updating cache data.

In the conventional technology described by referring to FIG. 1, even if no errors are detected in the cache line for storage in the cache memory at the first stage, a RAM error can occur in the process from the first stage to the second stage. If such an error occurs, then, for example, a 1-bit error can occur in the four bytes of the second half, which are not supposed to be stored data in the cache line that will be read from the cache memory at the second stage, and the cache line data referred to data in a cache line herein, is merged with the store data. As a result, a problem can arise in which a correct error correction code cannot be generated for the stored data. In this case, the stored data is not correct. Therefore, even if the error is detected by, for example, a parity check, the error cannot be corrected, and the error is processed as an irrevocable error. When RAM read troubles occur in reading a cache line for merging data, it is necessary to process an irrevocable error by suppressing the use of the data, which is a problem.

Patent document 1, as the conventional technology for correcting an error for cache memory, discloses the technology for reducing the overhead for detecting and correcting an error by providing a plurality of check bits for data bytes to check and correct an error in a pipeline system in the cache memory.

Patent document 2, as the conventional technology for correcting a software error, discloses the technology for checking the parity of data in a cache line, using the data as is without correcting an error if no parity error has been detected, and correcting an error if an error has been detected.

However, the conventional technology cannot solve the problem that a correct error correction code cannot be generated for stored data if an error has occurred after confirming that there is no error in the data stored in the cache memory until store data is actually written to the cache memory.

[Patent Document 1] Japanese Published Patent Application No. H3-108041 "Error Checking in Pipeline System/Corrected Cache Memory and Cache Memory Array"

[Patent Document 2] Japanese Published Patent Application No. 2004-514184 "Method and Apparatus for Correcting Software Error in Digital Data"

SUMMARY OF THE INVENTION

The present invention has been developed to solve the above-mentioned problems, and aims at successfully generating a correct error correction code even if a RAM error occurs before writing storage data to the cache memory.

As an error correction code generation method according to the present invention, a method of storing, before writing store data corresponding to a store instruction to cache memory, the data on a cache line for storing store data in a register, merging stored contents in the register with the store data, and generating an error correction code for the result of the merger, is disclosed.

The cache memory control device according to the present invention realizes the above-mentioned error correction code generation method and includes a buffer for storing store data, the register, a merger circuit for merging the stored contents of the register with store data, and an error correction code generation circuit for generating an error correction code.

As described above, according to the present invention, before writing store data to cache memory, the data on the cache line for storage is stored in the register configured by a flip-flop (FF) in which there is a low possibility of the occurrence of an error in store data, then the stored contents in the register is merged with the store data, and an error correction code is generated for the result of the merger.

According to the present inventions a correct error correction code can be generated even if a fault in RAM as cache memory occurs after confirming that there are no errors in the data on the cache line for storage before actually writing store data to cache memory; this contributes greatly to the improvement of the reliability of information processing.

BRIEF DESCRIPTION OF THE DRAWINGS

FIG. 3 is a block diagram of the configuration of the CPU to which the error correction code generation system according to the present invention is applied;

FIG. 6 is an explanatory view of registering a cache line for storage in the fetch data register;

DESCRIPTION OF THE PREFERRED EMBODIMENTS

Figure 1:
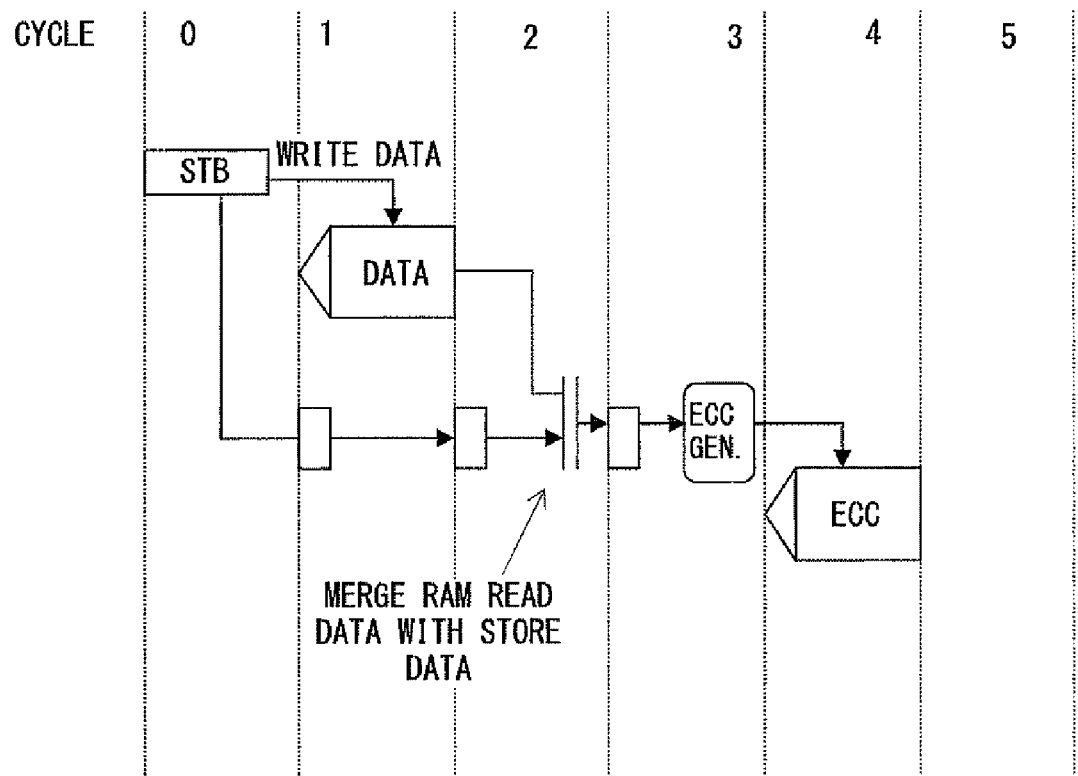
FIG. 1 is an explanatory view of conventional technology of the error correction code generation system
Figure 2:
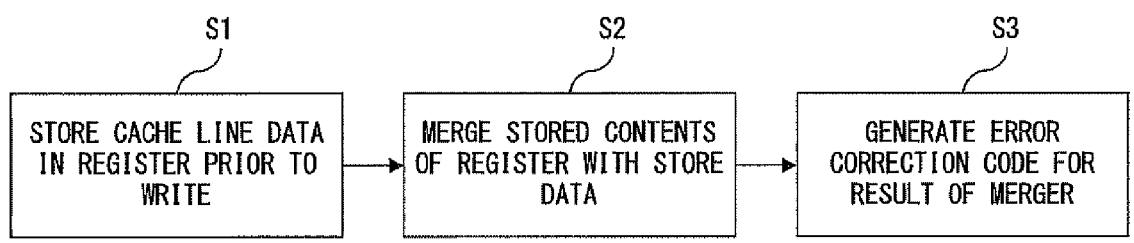
FIG. 2 is a block diagram showing the principal configuration of the error correction code generation method according to the present invention.

FIG. 2 is a block diagram showing the principally configuration of the error correction code generation method according to the present invention. In FIG. 2, in step S1, the data on the cache line for storage is stored in the register before writing store data to cache memory. The register can be, for example, a fetch data register (FCDR), which is described below.

In step S2, the stored contents of the register are merged with the store data. If one line of the cache memory is, for example, 8 bytes, the store data is written to the four bytes of the first half. Here, four bytes of the first half that are merged are store data and the four bytes of the second half are the data stored in the register as data not to be stored.

In step S3, an error correction code is generated by the error correction code generation circuit depending on the result of merging the stored contents of the register with the store data, and this error correction code is stored as ECC data in, for example, the RAM storing an error correction code.

FIG. 3 is a block diagram showing a configuration of the central processing unit (CPU) of the computer in which the error correction code generation system according to the present invention is used. In FIG. 3, a CPU 1 includes an instruction unit (IU) 2, an arithmetic execution unit (EU) 3, a primary data cache memory (L1D$) 4, a primary instruction cache memory (L1I$) 5, and a secondary cache memory (L2$) 6.

Figure 4:
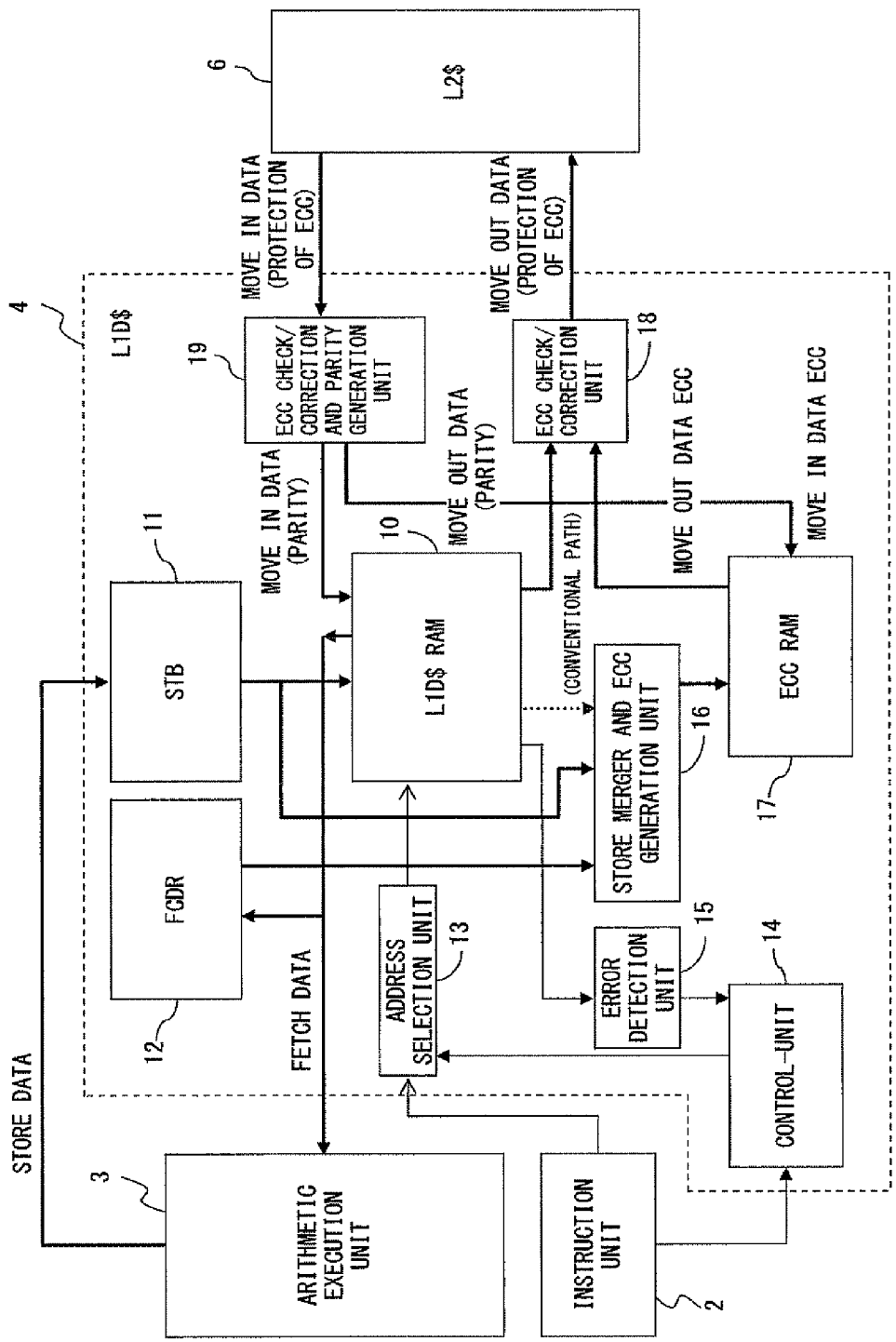
FIG. 4 is a block diagram of a detailed configuration of the primary data cache memory shown in FIG. 3.

The error correction code generation system according to the present invention is realized by the primary data cache memory (L1D$) 4 shown in FIG. 3, and FIG. 4 is a block diagram showing the configuration of the primary data cache memory in detail. FIG. 4 also shows the instruction unit 2, the arithmetic execution unit 3, and the secondary cache memory 6 connected to the primary data cache memory 4.

The primary data cache memory 4 includes memory for actually storing data, i.e., an L1D$ RAM 10 as operand cache, a store buffer 11 for receiving store data from the arithmetic execution unit 3 and temporarily storing the data, and, as the most characteristic elements of this embodiment, a fetch data register (FCDR) 12 for temporarily storing the cache line data for storage in primary data cache memory 10, an address selection unit 13 for specifying an address corresponding to the primary data cache memory 10 via an instruction from the instruction unit 2, a control unit 14 for controlling the operation of the address selection unit 13 or other such devices, an error detection unit 15 for detecting an error of the data in the primary data cache memory 10, a store merger and ECC generation unit 16 for merging the data in the store buffer 11 with the data stored in the FCDR 12 and generating an error correction code (ECC) for the result of the merger, an ECC RAM 17 for storing the generated ECC, an ECC check/correction unit 18 for checking an ECC for move-out data from the primary data cache memory 10 to the secondary cache memory 6, and an ECC check/correction and parity generation unit 19 for checking an ECC for move-in data from secondary cache memory 6 and generating a parity for move-in data. The data transferred between the secondary cache memory 6 and the primary data cache memory 4 is protected by the ECC, and the data stored in the primary data cache memory is protected by the parity. The cache memory control device according to the present invention is configured by all blocks except the L1D$ RAM 10 in the primary data cache memory 4 shown in FIG. 4.

Figure 5:
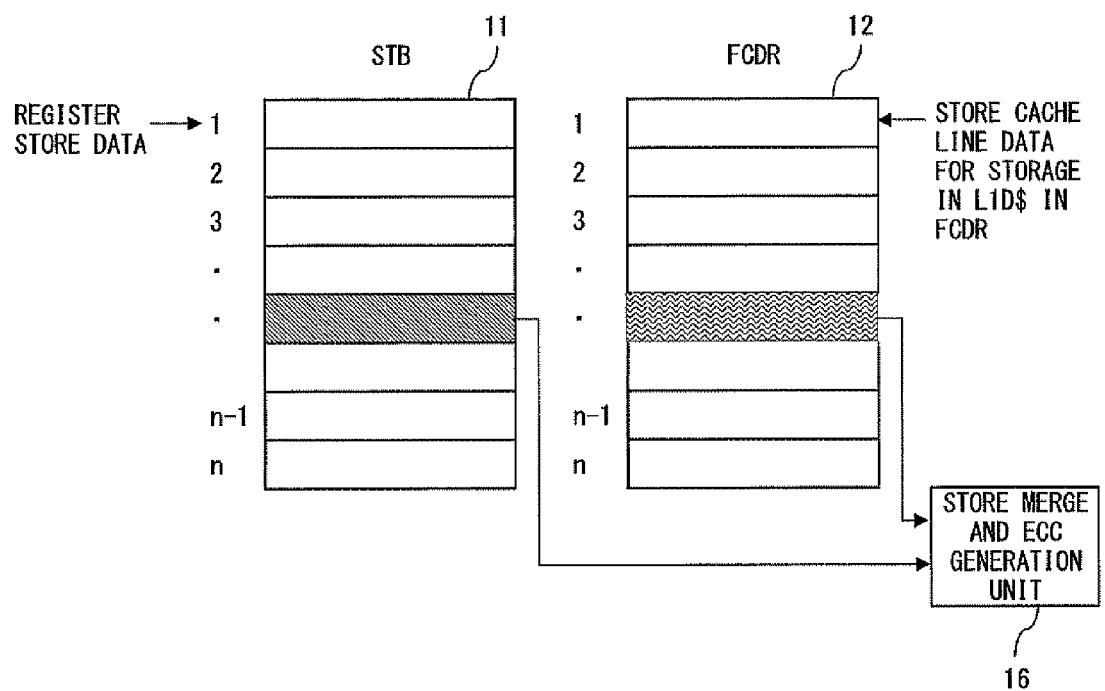
FIG. 5 is an explanatory view of the configuration of the store buffer and the fetch data register.

FIG. 5 is an explanatory view of the configuration of the store buffer 11 and the fetch data register 12 shown in FIG. 4. In FIG. 5, both the store buffer (STB) 11 and the fetch data register 12 are provided with n entries, store data is registered in each entry of the store buffer 11, and the cache line data for storage before writing the store data in the primary data cache memory is registered in each entry in the fetch data register 12. In the store data in the STB 11 and the registered data in the FCDR 12, the data corresponding to the same cache line is read in a one-to-one format and provided for the store merger and ECC generation unit 16.

On the other hand, of the conventional technology, cache line data for storage is provided for the store merger and ECC generation unit 16 from the L1D$ RAM 10 in FIG. 4, which is shown as a dotted line in the figure, and the data is merged with the data of the store buffer 11.

In FIG. 5, for n entries for both the STB 11 and the FCDR 12, data corresponding to different cache lines is essentially stored for each of entry. However, if data is continuously stored for the same address, that is, the same cache line, the data corresponding to the same cache line can be stored in a plurality of entries.

FIG. 6 is an explanatory view of the registering operation on the cache line data for storage in the FCDR 12 according to the present mode for embodying the present invention. In the present mode for embodying the present invention, as described above, the data write in the primary data cache memory 10 and the generation of an ECC are performed in two stages, and the first stage is performed as an operation as a result of a request from an instruction unit, which is referred to as an IU-REQ herein, or by an ST1 request indicating the first stage of the storing operation, which is referred to as an ST1-REQ herein. FIG. 6 is an explanatory view of an operation corresponding to the first stage, which is, corresponding to the IU-REQ/ST1-REQ.

In cycle 1 shown in FIG. 6, the cache line data for storage which is confirmed to have no errors is provided from the primary data cache memory 10 to a selector 21, the data for an upper input terminal of the selector 21 is selected in cycle 2, passed through a register 22 in cycle 3, and the data is stored in the FCDR 12 in cycle 4. The data stored in the FCDR 12 is the cache line data for storage specified by the address at which the store data is to be stored and is the data in which no errors are found on the cache line before writing store data.

Figure 7:
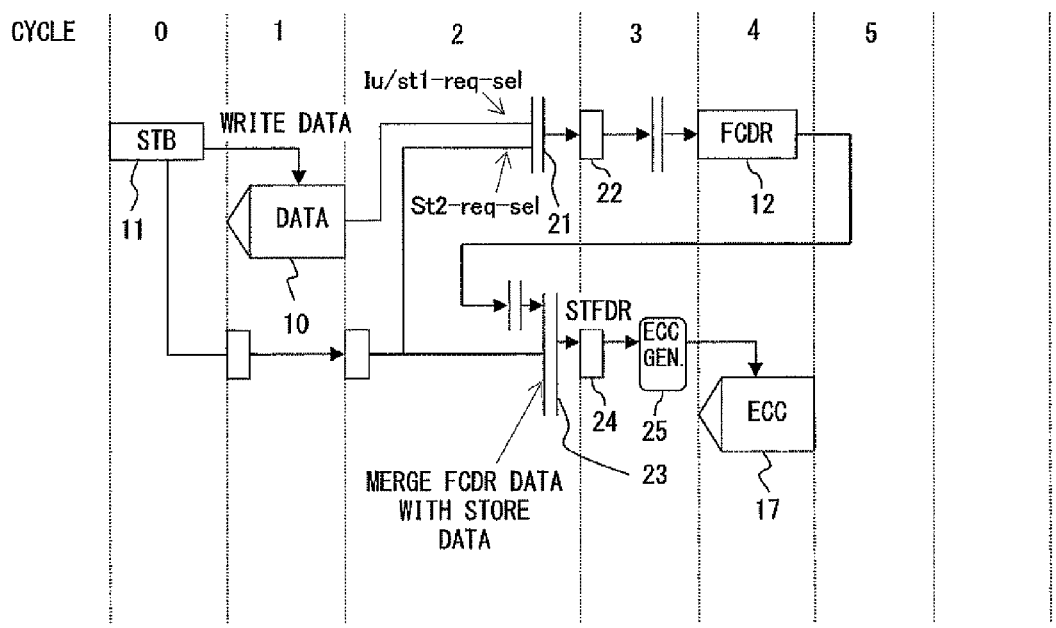
FIG. 7 is an explanatory view of the generation of an error correction code by merging data stored in the fetch data register with store data.

FIG. 7 is an explanatory view of the operation in the second stage of data storage in the cache memory. The second stage is described as an operation corresponding to a ST2-REQ, wherein the ST2-REQ is an ST2 request indicating the second stage of the storing operation. FIG. 7 shows the first operation corresponding to IU-REQ/ST1-REQ in FIG. 6 and the second operation corresponding to ST2-REQ in cycles 0 through 5. As stated in the time chart of FIG. 8, the operation of FIG. 6 is followed by the second operation in FIG. 7.

In FIG. 7, the data which will be read from the store buffer 11 in cycle 0 of the operation corresponding to the ST2-REQ is provided for the primary data cache memory 10 as the write data to the cache memory in cycle 1. On the other hand, the data stored in the store buffer 11 is selected and output by the selector 21 in cycle 2, and stored in the relay buffer 22 in cycle 3. That is, in cycle 2, as the operation corresponding to the ST2-REQ, the data for the lower input terminal is selected and output in two pieces of input data to the selector 21. In cycle 4, the data in the relay buffer 22, that is, the store data, is provided for the fetch data register 12, and the data held by the FCDR 12 is updated.

In cycle 2, as the operation corresponding to the ST2-REQ, the store data is output by the selector 21 to the relay buffer 22. Then, the cache line data for storage that is stored in the FCDR 12 before the store data is written in cache memory and as the operation corresponding to the IU-REQ/ST1-REQ is output from the FCDR 12 and is merged with the store data that is output from the store buffer 11 by a merge circuit 23, and the result of the merger is stored in a store fetch data register (STFDR) 24; the ECC depending on the data merged in cycle 3 is then generated by an ECC generation circuit 25 and is stored in the ECC RAM 17 in cycle 4.

There is a possibility that a 1-bit error may occur in the cache line data which is written to the store data, i.e., data that is not supported to be stored corresponding to four bytes of the second half in eight bytes. However, an error correction code is correctly generated, and a check using the error correction code is performed for the cache line data that is written to store data by the ECC check/correction unit 18 shown in FIG. 4, thereby correcting the error.

With respect to the scope of the claims according to the present invention, the buffer according to claims 4 and 5 corresponds to the store buffer 11, the register according to claims 4 and 5 corresponds to the fetch data register (FCDR) 12, and the merger result hold register according to claims 4 and 5 corresponds to the store fetch data register (STFDR) 24.

Figure 8:
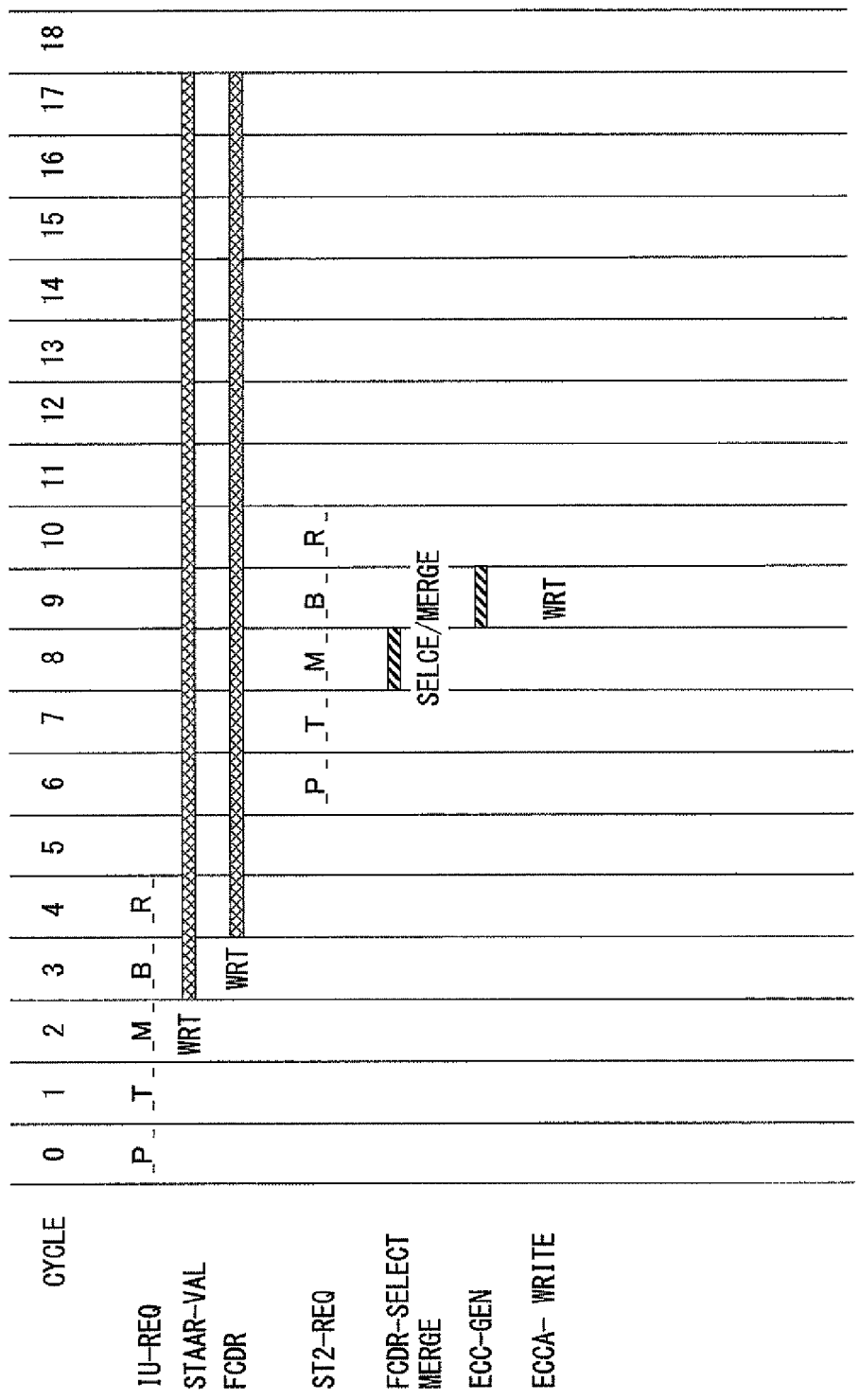
FIG. 8 is a timing chart showing up to the generation of an error correction code.

FIG. 8 is a timing chart of the operation corresponding to the IU-REQ and the operation corresponding to the ST2-REQ. As processes of the pipeline corresponding to the IU-REQ, cycle is a priority cycle, cycle 1 is a tag cycle, cycle 2 is a matching cycle, cycle 3 is a buffer cycle, and cycle 4 is a result cycle. When the store address is valid in cycle 3, a write to the FCDR, that is, storing data for FCDR in the cache line for storage, is performed.

The operation corresponding to the ST2-REQ is performed as the process of the priority cycle in cycle 6, as the process of the tag cycle in cycle 7, as the process of the matching cycle in cycle 8, as the process of the buffer cycle in cycle 9, and as the process of the result cycle in cycle 10. FDCR-SELECT, that is, the contents of the FDCR, is selected and read in cycle 8 and merged with storage data. In cycle 9, an ECC is generated depending on the result, and a write to the ECC arrays is performed.

As described in FIG. 5, according to the present mode for embodying the present invention, n entries are provided for both the store buffer 11 and the FCDR 12, and the store data and the cache line data for storage are registered in a one-to-one format in the entries of the STB 11 and the FCDR 12 in response to the data write to the cache memory. For example, if data is stored continuously at the same address, that is, in the same cache line, the data is registered in a plurality of entries in the STB 11 and the FCDR 12, and the data write process is continuously performed.

Figure 9:
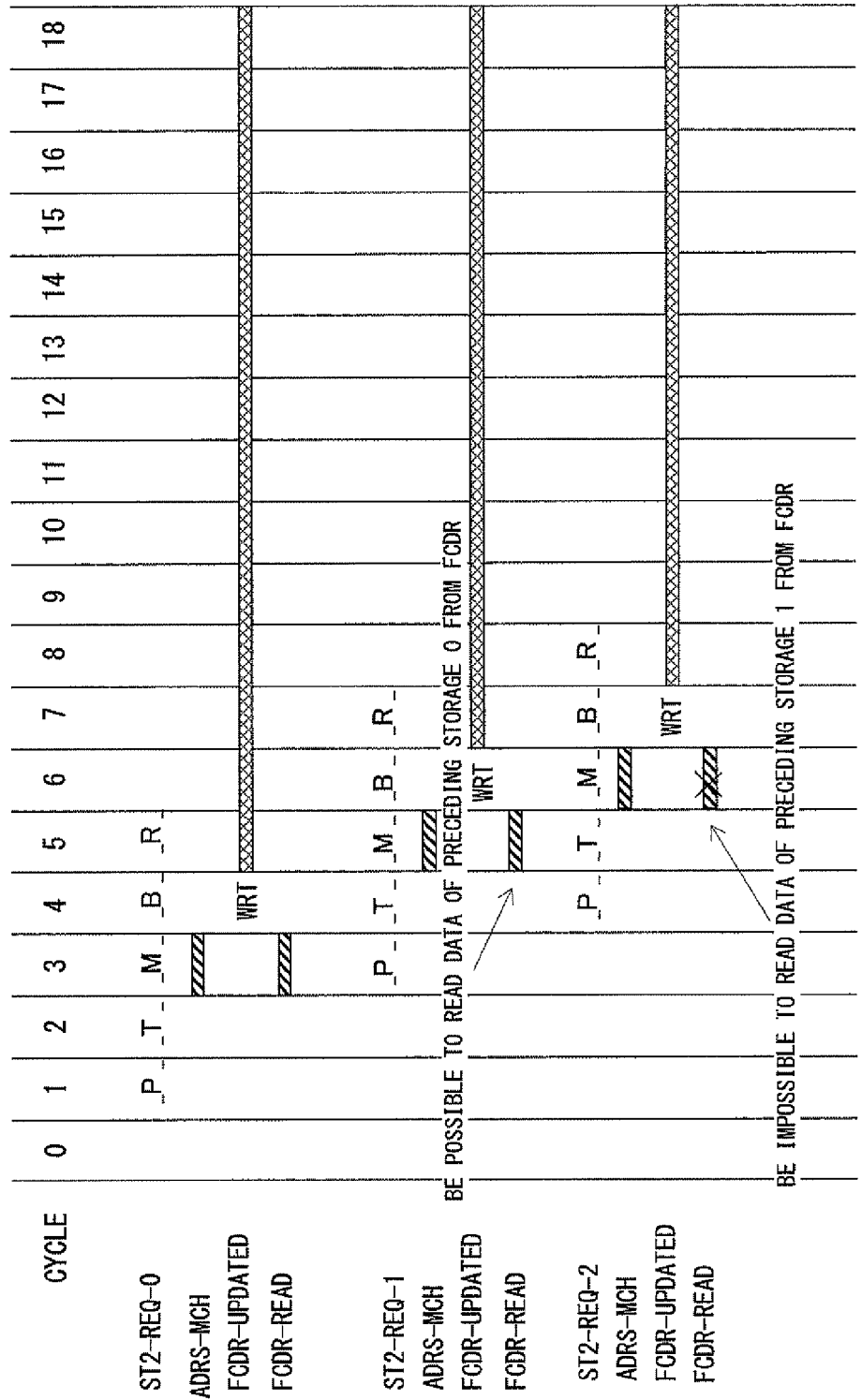
FIG. 9 is an explanatory view showing a problem with the data continuous storage operation at the same address.

In FIG. 9, the description of the operation corresponding to the IU-REQ is omitted, and a read operation of the stored contents of the FCDR for merging with the store data corresponding to the three continuous ST2-REQ operations is described below. First, as the operation corresponding to ST2-REQ-0 shown in FIG. 9, an address matching is detected in cycle 3. Although not shown in the attached drawings, it is described by referring to cycle 2 shown in FIG. 7: the read of the stored contents of the FCDR 12 is performed, the stored contents are merged with the store data, and an ECC for the result of the merger is generated. On the other hand, as described above by referring to FIG. 7, as an operation corresponding to the ST2-REQ, store data is provided for the FCDR 12 through the selector 21 and the relay buffer 22, and the stored contents of the FCDR 12 are updated.

The operation of the pipeline corresponding to the ST2-REQ-1 shown in FIG. 9 is started with a 2-cycle delay behind the operation of the pipeline corresponding to the ST2-REQ-0. In this case, the address matching and the reading of the stored contents are performed in cycle 5. At this time, the FCDR 12 is updated using the store data corresponding to the preceding store instruction, the cache line data for storage including the preceding store data can be read from the FCDR 12, and a newly correct ECC can be generated via the merger with new storage data. Then, the FCDR 12 can be updated using new store data in cycle 7.

The operation of the pipeline corresponding to ST2-REQ-2 shown in FIG. 9 is started one cycle behind the operation of the pipeline corresponding to ST2-REQ-1. In this case, in cycle 6, address matching is detected, and the stored contents of the FCDR 12 are read, but the updating operation of the FCDR 12 to be performed as an operation corresponding to the ST2-REQ-1 in response to the preceding store instruction has not been performed yet, and a problem arises in which a correct ECC cannot be generated by using a result of merging the data which will be read from the FCDR 12 with store data.

Figure 10:
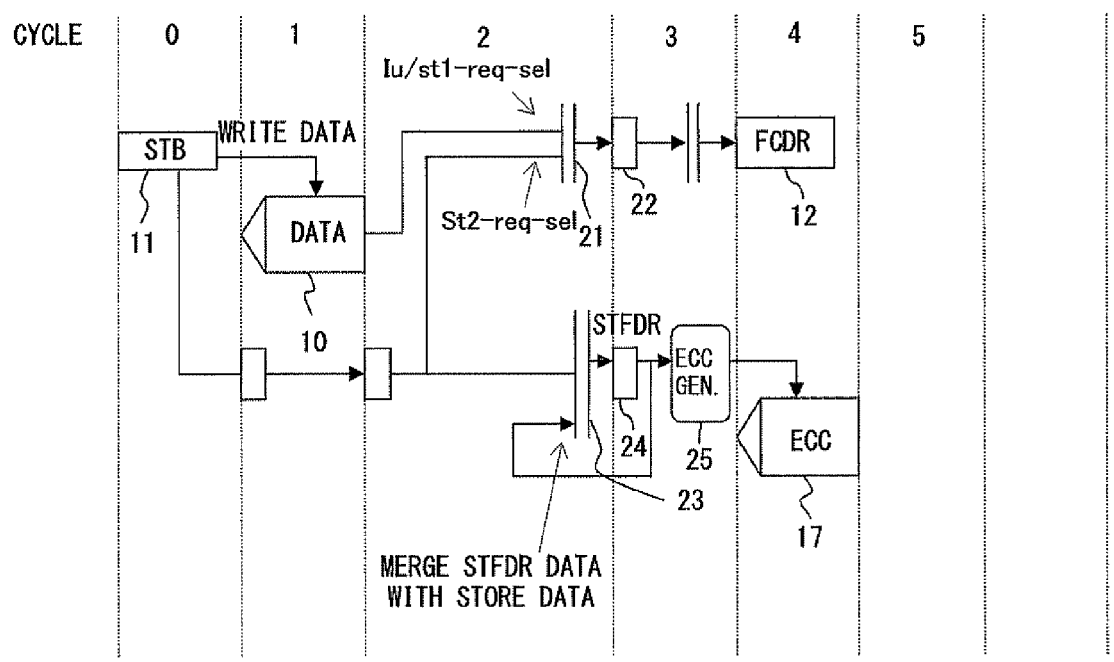
FIG. 10 is an explanatory view showing a method for generating a correct error correction code for the data continuous storage operation at the same address.

FIG. 10 is an explanatory view of the ECC generation system according to a mode for embodying the present invention realized when data is continuously stored at the same address, that is, on the same cache line as described above. As described above by referring to FIG. 9, if the contents of the FCDR 12 is read in response to the continuous storage and the store data is written, then there is a possibility that the stored contents will be read and merged with the store data before updating of the stored contents of the FCDR 12 by the preceding store instruction. Therefore, as shown in FIG. 10, the result of merging the store data corresponding to the preceding store instruction stored in the store fetch data register (STFDR) 24 in response to the preceding store instruction is fed back to the input side of the merge circuit 23, and the store data corresponding to the new store instruction is merged with the fed back data and stored in the STSDR 24 again, and a new ECC is generated by using the stored contents, thereby generating a new correct ECC in response to a subsequent store instruction.

What is claimed is:

1. An error correction code generation method, comprising:
    storing data of a cache line on which a store data accompany with a store instruction is to be written to a register prior to writing the store data in a cache memory;
    detecting an error of the data of the cache line to be written in the cache memory;
    writing the store data that is confirmed to have no errors in the cache memory;
    merging the data stored in the register with the store data in the cache memory accompany with the store instruction; and
    generating an error correction code for a result of the merging.

2. The method according to claim 1, wherein
    the merging merges the store data in the register with the store data accompany with the store instruction when a store instruction subsequent to the store instruction is a instruction for storing data on said cache line, the result of the merger corresponding to the store instruction is merged with the store data accompany with the subsequent store instruction, and
    the generating generates an error correction code corresponding to the subsequent store instruction by using the result of the merging.

3. The method according to claim 2, wherein the cache memory is configured by random access memory.

4. The method according to claim 1, wherein the cache memory is configured by random access memory.

5. A cache memory control device, comprising:
    a buffer that stores data in accordance with a store instruction;
    a register that stores data of a cache line on which a data is to be written in accordance with store instruction, prior to writing the store data in a cache memory;
    a detection unit that detects an error of the data of the cache line to be written in the cache memory;
    a merge circuit that merges the data stored in the register with the data stored in the cache memory accompany with the store instruction; and
    an error correction code generation circuit that generates an error correction code for a result of the merger, wherein the store data which is confirmed to have no errors is written in the cache memory.

6. The device according to claim 5, wherein
    the merge circuit merges the stored data in the register with the store data accompany with the store instruction in response to a preceding store instruction in continuous store instructions to write data on a same cache line, and
    the merge circuit merges the data merged accompany with the preceding store instruction with store data accompany with a subsequent store instruction.

7. The device according to claim 6, wherein the cache memory is configured by random access memory.

8. The device according to claim 5, wherein the cache memory is configured by random access memory.

* * * * *